(12) United States Patent
Winograd

(10) Patent No.: US 7,612,583 B2
(45) Date of Patent: Nov. 3, 2009

(54) EFFICIENT XOR CALCULATION

(75) Inventor: Gil I. Winograd, Aliso Viejo, CA (US)

(73) Assignee: Novelics, LLC, Aliso Viejo, CA (US)

( * ) Notice: Subject to any disclaimer, the term of this patent is extended or adjusted under 35 U.S.C. 154(b) by 0 days.

(21) Appl. No.: 12/131,920

(22) Filed: Jun. 2, 2008

(65) Prior Publication Data
US 2008/0297197 A1 Dec. 4, 2008

Related U.S. Application Data

(60) Provisional application No. 60/941,482, filed on Jun. 1, 2007.

(51) Int. Cl.
*H03K 19/21* (2006.01)
(52) U.S. Cl. .......................... 326/54; 326/52
(58) Field of Classification Search ................... 326/52, 326/54
See application file for complete search history.

(56) References Cited

U.S. PATENT DOCUMENTS 6,356,112 B1* 3/2002 Tran et al. ................. 326/52
6,788,106 B2* 9/2004 Kwak et al. ................ 326/52
6,992,506 B2* 1/2006 Park et al. .................. 326/52

\* cited by examiner

*Primary Examiner*—Rexford N Barnie
*Assistant Examiner*—Crystal L Hammond
(74) *Attorney, Agent, or Firm*—Haynes & Boone, LLP.

(57) ABSTRACT

In one embodiment, an exclusive-OR (XOR) calculation circuit configured to XOR a plurality of N input signals ranging from a first signal to an Nth signal is provided. The calculation circuit includes: a plurality of logic circuits arranged from a first logic circuit to a last logic circuit, wherein each logic circuit is configured to receive two logical input signals and the complement of the two logical input signals and to provide an XOR output signal and an XNOR output signal, wherein the XOR output signal represents the XOR of its two input signals and the XNOR output signal represents an exclusive-NOT-OR (XNOR) of its two input signals, and wherein the first logic circuit receives two of the N input signals as its logical input signals, a second logic circuit receives another one of the N input signals and an XOR output signal from the first logic circuit as its logical input signals, and so on such that the last logic circuit receives a remaining one of the N input signals and an XOR output signal from a next-to-last logic circuit as its logical input signals.

1 Claim, 5 Drawing Sheets

| Real Position | Type | Check 1 | Check 2 | Check 3 | Check 4 | Check 5 | Check 6 | Check 7 | Memory Position | # of XOR$_1$ |
|---|---|---|---|---|---|---|---|---|---|---|
| 48 | d41 | X |  |  |  | X | X |  | 47 | 1 |
| 49 | d42 | X |  |  | X | X |  |  | 48 | 2 |
| 50 | d43 |  | X |  | X | X |  |  | 49 | 2 |
| 51 | d44 | X | X |  | X | X |  |  | 50 | 3 |
| 52 | d45 |  | X |  | X | X |  |  | 51 | 2 |
| 53 | d46 | X |  | X | X | X |  |  | 52 | 3 |
| 54 | d47 |  | X | X |  | X |  |  | 53 | 3 |
| 55 | d48 | X | X | X |  | X | X |  | 54 | 3 |
| 56 | d49 |  |  |  | X | X |  |  | 55 | 1 |
| 57 | d50 |  | X |  | X | X |  |  | 56 | 2 |
| 58 | d51 |  |  | X | X | X | X |  | 57 | 2 |
| 59 | d52 | X |  | X | X | X | X |  | 58 | 3 |
| 60 | d53 |  |  | X | X | X |  |  | 59 | 1 |
| 61 | d54 | X |  | X | X | X |  |  | 60 | 2 |
| 62 | d55 |  | X | X | X | X |  |  | 61 | 1 |
| 63 | d56 | X | X | X | X | X |  |  | 62 | 0 |
| 64 | P7 |  |  |  |  |  |  | X | 63 | 1 |
| 65 | d57 | X |  |  |  |  |  | X | 64 | 2 |
| 66 | d58 |  | X |  |  |  |  | X | 65 | 2 |
| 67 | d59 | X | X |  |  |  |  | X | 66 | 3 |
| 68 | d60 |  |  | X |  |  |  | X | 67 | 1 |
| 69 | d61 | X |  | X |  |  |  | X | 68 | 2 |
| 70 | d62 |  | X | X |  |  |  | X | 69 | 2 |
| 71 | d63 | X | X | X |  |  |  | X | 70 | 0 |

FIG. 5

EFFICIENT XOR CALCULATION

RELATED APPLICATION

This application claims the benefit of U.S. Provisional Application No. 60/941,482, filed Jun. 1, 2007, the contents of which is hereby incorporated by reference.

TECHNICAL FIELD

This application relates generally to error correction using XOR calculations, and more particularly to an efficient XOR calculation and error correction technique

BACKGROUND

It is often desired to compute the parity of a multi-bit word. Many common error detection and error correction schemes such as a Hamming error correction code (ECC) require a parity computation. Parity is typically computed electrically by means of an exclusive-OR (XOR) gate. Parity computations could be performed with an n-input XOR gate (n being an integer greater than two) but in general such computations are implemented using a collection of two-input XOR gates with appropriate interconnections. However, two-input XOR gates are notoriously slow. The core of the XOR gate usually requires both the input signals and their logical complement. This complement must either be computed internally or provided externally. In case of internal computation, the gates often require two delay (computation) stages. In case of external computation, the XOR gate may require only a single delay stage, but the external circuit must suffer a delay stage penalty to provide the signal complement. There are some variations of XOR gates that do not require complement signals and require only a single delay stage of computation. However, these gates do not actively drive or buffer their output for at least some input combinations (i.e. the output is directly connected to the input). These type of gates are not suitable to be cascaded in large numbers to make n-input XOR gates because the signal drive capability gets progressively weaker as the input signals pass through multiple 2-input XOR gates.

Accordingly, there is a need in the art for improved XOR calculation architectures.

SUMMARY

This section summarizes some features of the invention. Other features are described in the subsequent sections.

In accordance with an embodiment of the invention, an exclusive-OR (XOR) calculation circuit configured to XOR a plurality of N input signals ranging from a first signal to an Nth signal is provided. The calculation circuit includes: a plurality of logic circuits arranged from a first logic circuit to a last logic circuit, wherein each logic circuit is configured to receive two logical input signals and the complement of the two logical input signals and to provide an XOR output signal and an XNOR output signal, wherein the XOR output signal represents the XOR of its two input signals and the XNOR output signal represents an exclusive-NOT-OR (XNOR) of its two input signals, and wherein the first logic circuit receives two of the N input signals as its logical input signals, a second logic circuit receives another one of the N input signals and an XOR output signal from the first logic circuit as its logical input signals, and so on such that the last logic circuit receives a remaining one of the N input signals and an XOR output signal from a next-to-last logic The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 5 is a table illustrating the XOR calculations for a (71,64) memory with error correction.

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
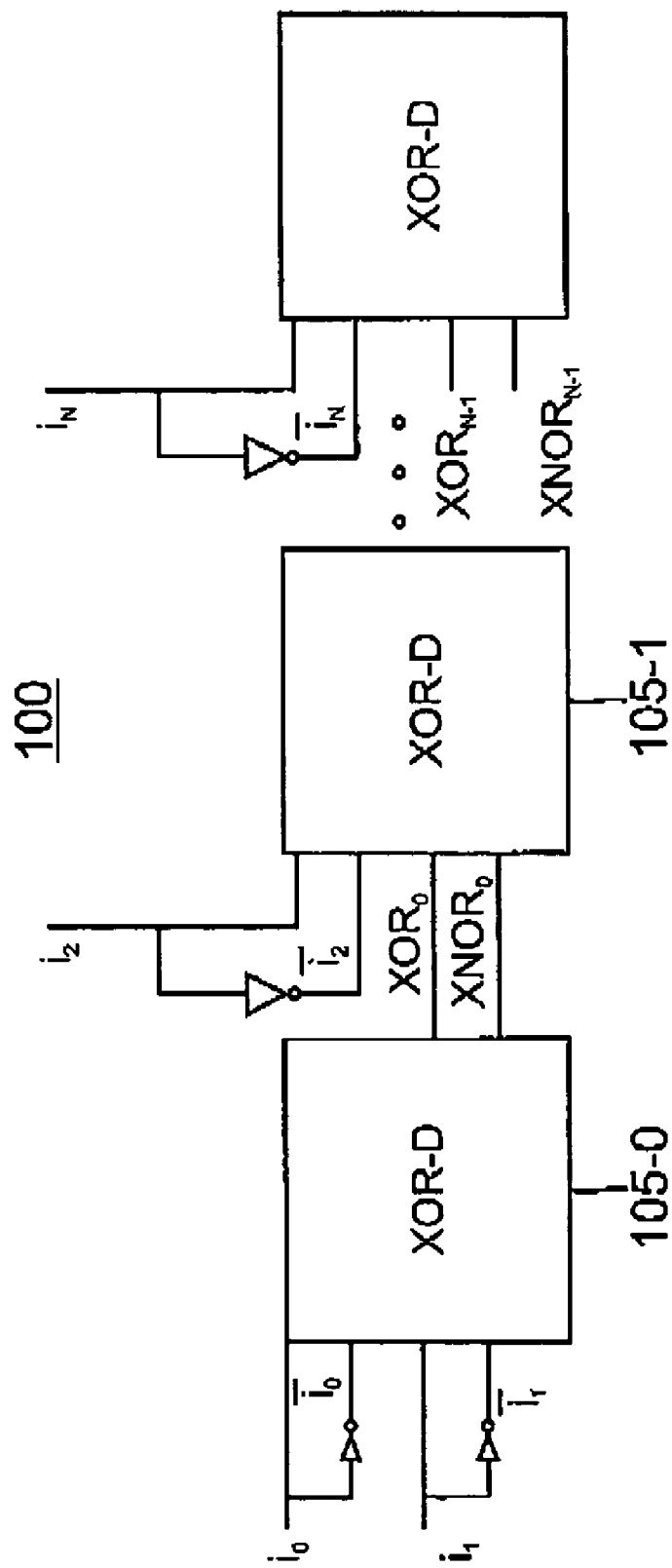
FIG. 1 is a conceptual view of a serial XOR calculation architecture.

Turning now to the drawings, FIG. 1 illustrates an embodiment of a serial XOR calculation circuit 100. Circuit 100 includes a serial cascade of logic circuits 105. Each logic circuit receives two input signals and the complement of these two input signals and provides the XOR and XNOR of these input signals. Because both each circuit 105 outputs an XOR and an XNOR output signal, circuits 105 are denoted herein as "XOR-D" (XOR dual output) circuits. An arbitrary plurality N of input signals bits may be XOR'd using circuits 105. A first XOR-D circuit 105-0 processes two of the input signals (designated as $i_0$ and $i_1$). The XOR and XNOR outputs for circuit 105-0 are designated as $XOR_0$ and $XNOR_0$. A subsequent XOR-D circuit 105-1 receives $XOR_0$ and $XNOR_0$ as well as another input signal $i_2$ and its complement. This pattern is continued such that an a final XOR-D circuit 105-(N-1) receives the $XOR_{N-1}$ and $XNOR_{N-1}$ outputs from a preceding XOR-D circuit (not illustrated) as well as a final input signal $i_N$ and its complement. It may thus be seen that to XOR an arbitrary plurality of N input signals $i_0$ through $i_N$ requires (N-1) XOR-D circuits.

Figure 2:
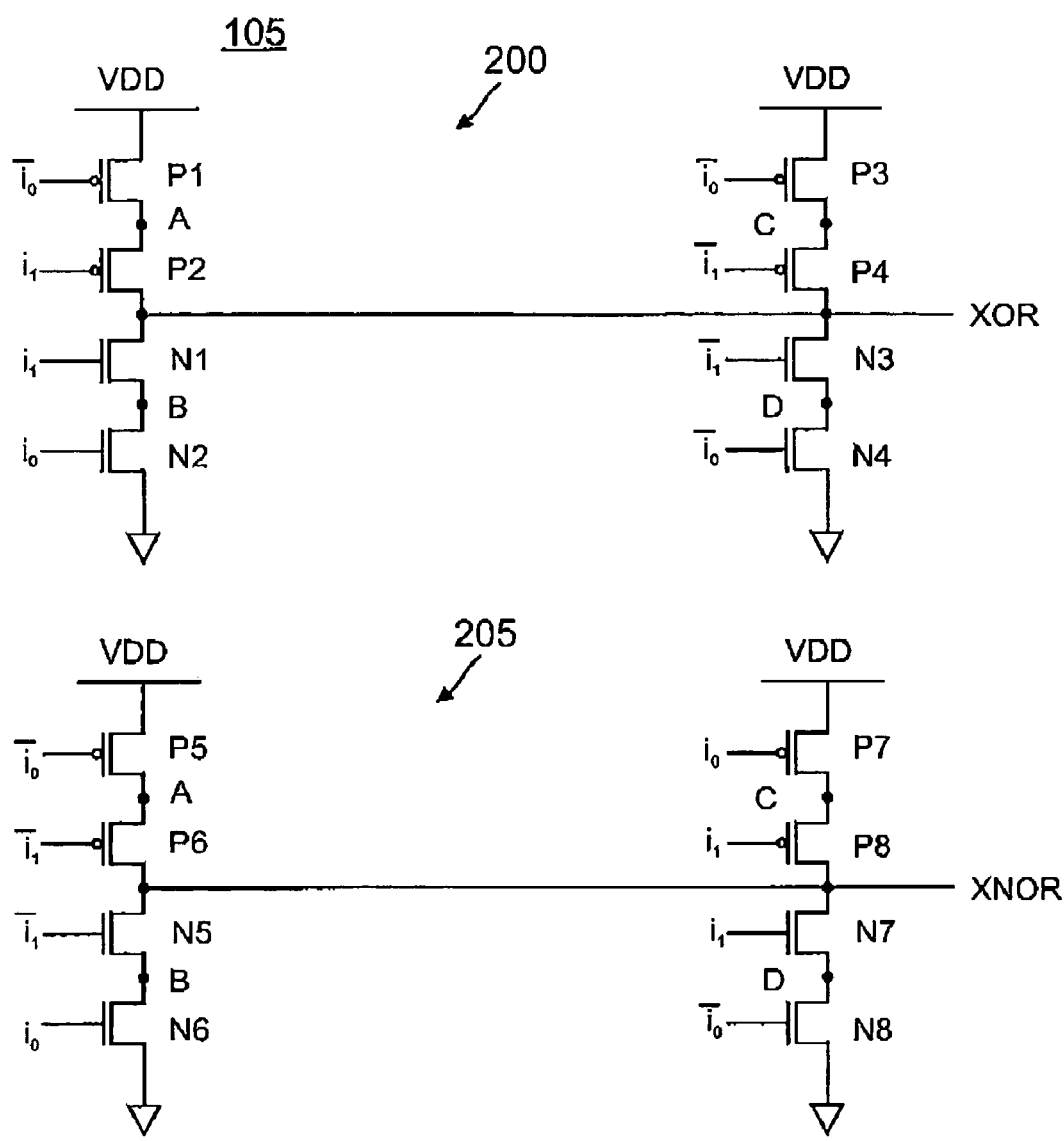
FIG. 2 is a schematic illustration of an dual-input XOR (XOR-D) circuit.

Each XOR-D circuit 105 may be implemented as shown in FIG. 2. The input signals correspond to i0 and i1 and their complements such that an instantiation of XOR-D circuit 205-1 is shown but it will be appreciated that the remaining XOR-D circuits are configured analogously. Eight transistors are dedicated to respective XOR and XNOR production by an XOR stack 200 and an XNOR stack 205. XOR stack 200 includes two pairs of serially-coupled PMOS transistors coupled between an XOR output node and a power supply node VDD. A first pair of PMOS transistors P1 and P2 have their gates controlled by the complement of $i_0$ and the true version of $i_1$, respectively. A second pair of transistors P3 and P4 have their gates controlled by $i_0$ and the complement of $i_1$, respectively. The XOR output node also couples to ground through two pairs of serially-coupled NMOS transistors. A first NMOS pair of transistors N1 and N2 have their gates driven by i1 and i0, respectively. A second NMOS pair of transistors N3 and N4 have their gates driven by the complement of $i_1$ and the complement of $i_0$, respectively. It may thus be seen that the XOR output represents the logical XOR of input signals $i_0$ and $i_1$. For example, if both signals are zero (in a logical low system), N3 and N4 will be conducting so as to pull the XOR output node low. On the other hand, if $i_0$ is high and $i_1$ is low, transistors P1 and P2 will conduct so as to pull the XOR output high. Similarly, if $i_0$ is low and $i_1$ is high, transistors P3 and P4 will conduct so as to pull the XOR output high. Finally, if both inputs are high, transistors N1 and N2 will conduct so as to pull the XOR output low.

The XNOR output node is also coupled to a power supply node VDD through two pairs of PMOS transistors. A first pair of transistors P5 and P6 have their gates driven by the complement of $i_0$ and the complement of $i_1$, respectively. A second pair of transistors P7 and P8 have their gates driven by $i_0$ and $i_1$, respectively. The XNOR output node also couples to ground through two pairs of NMOS transistors. A first pair of transistors N5 and N6 have their gates driven by the complement of $i_1$ and the true version of $i_0$, respectively. A second pair of transistors N7 and N8 have their gates driven by $i_1$ and the complement of $i_0$, respectively. It may thus be seen that the XNOR output node represents the XNOR of the input signals $i_0$ and $i_1$. If both signals are low, transistors P7 and P8 will conduct so as pull the XNOR node high. Similarly, if both signals are high, transistors P5 and P6 will conduct so as to pull the XNOR output node high. However, if $i_0$ and $i_1$ high, transistors N7 and N8 will conduct so as to pull the XNOR output node low. Similarly, if $i_0$ is high and $i_1$ is low, transistors N5 and N6 will conduct so as to pull the XNOR output node low. Thus, for a given logical state of the two input signals for an XOR-D circuit, only one stack of transistors (either a PMOS stack or an NMOS stack) will be conducting with regard to either of the XOR and XNOR output nodes. Since each output node couples through 4 such stacks (two NMOS and two PMOS pairs), the remaining transistors stacks will have at least one transistor non-conducting for the given logical state of the input signals.

Figure 3:
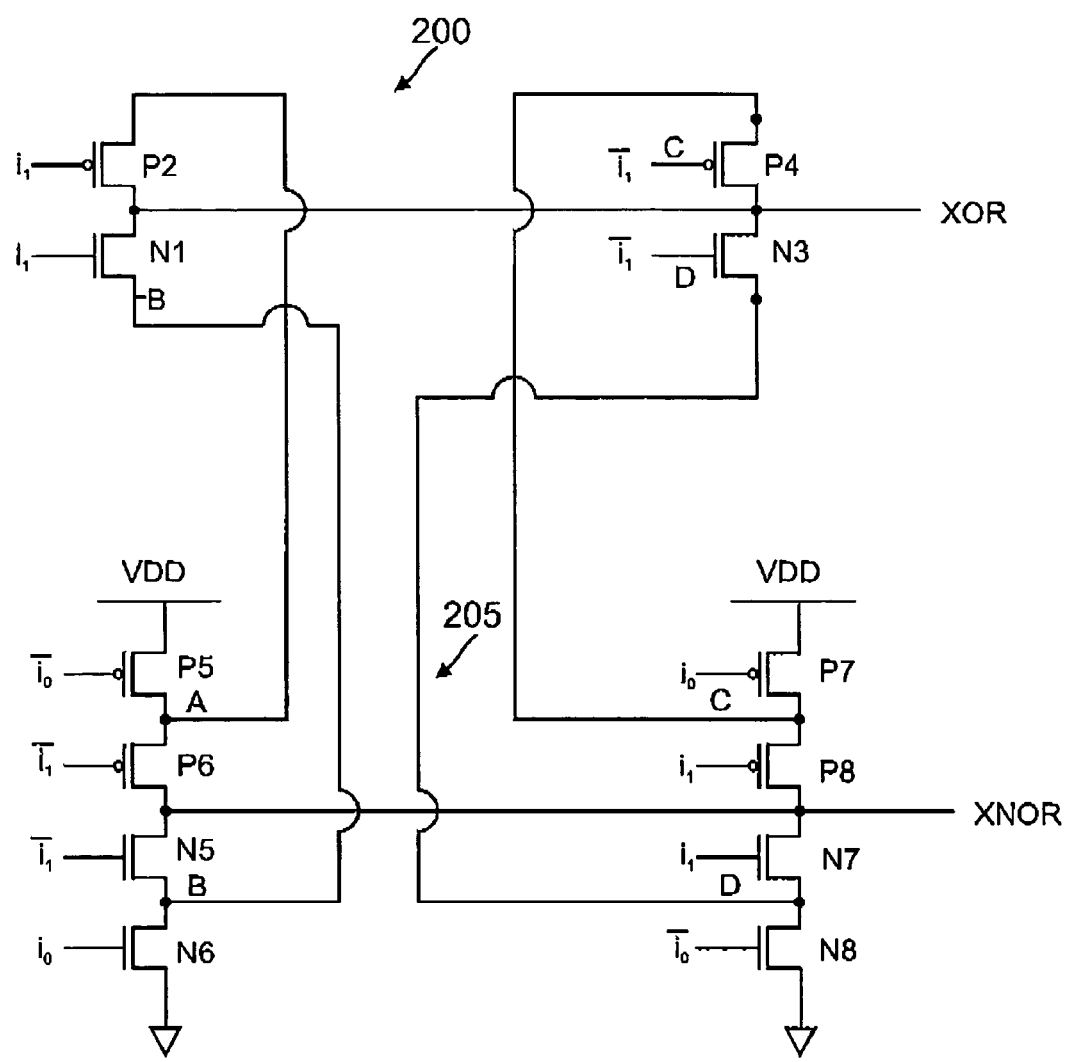
FIG. 3 is a schematic illustration of a shared-transistor modification of the circuit of FIG. 2.

Examination of FIG. 2 shows that the electrical behavior of a node A in stacks 200 and 205 (between transistors P1 and P2 and also between transistors P5 and P6) is the same. Similarly, the electrical behavior of a node B in stacks 200 and 205 (between transistors N1 and N2 and also between transistors N5 and N6) is the same. Thus, the nodes A may be shorted together and one of transistors P1 and P5 eliminated. Similarly, nodes B may be shorted together and one of transistors N2 and N5 eliminated. The same situation exists between a node C and transistors P3 and P7 as well as a node D and transistors N4 and N8. The resulting modification of XOR-D circuit 105 is illustrated in FIG. 3. In this embodiment, transistors P1, N2, N4, and P3 were eliminated but it will be appreciated that other elimination selections could be made. To increase speed with the same density as in the original sixteen transistor embodiment of FIG. 2, transistors P5, P7, N6, and N8 of FIG. 3 may be increased twice in size with regard to that used for the transistors in FIG. 2. Because transistor speed is a function of both load and drive and the load is unchanged (for the larger transistors) whereas the drive is increased, the overall circuit speed is increased.

Figure 4:
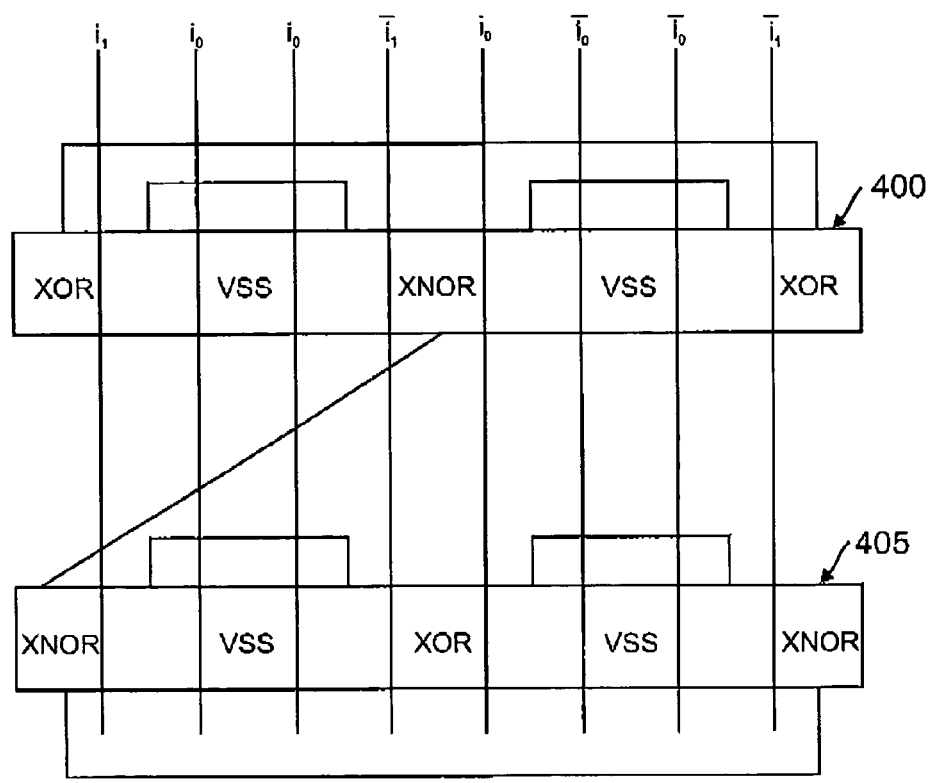
FIG. 4 is an illustration of a layout for the circuit of FIG. 3.

Turning now to FIG. 4, an efficient layout is provided for an implementation of an XOR-D circuit. As seen with regard to FIG. 3, the respective NMOS transistors may be formed using a diffusion die 400 so as to dope diffusion regions between channels formed by polysilicon gates/conductors carrying the input signals. Similarly, the respective PMOS transistors may be formed using a similar diffusion die 405 so as to dope diffusion regions between channels formed by the polysilicon gate/conductors.

The resulting XOR computation circuit of FIG. 1 may be used in a wide variety of applications. For example, it is common to XOR signals during in an error correction code (ECC) such as a Hamming code, which corrects for single-bit errors. To implement a single-bit error correction for a given word, it is necessary to append extra redundant bits, which are denoted as parity bits. If the received words are stored in memory, extra storage must be provided for these parity bits. A single-bit error correction Hamming code may be extended to allow dual-bit error correction (DED). The following table shows the number of parity bits required to implement a Hamming ECC-DED code for various word widths

| Word width | ECC | ECC + DED |
|---|---|---|
| 1 | 2 | 3 |
| 2-4 | 3 | 4 |
| 5-11 | 4 | 5 |
| 12-27 | 5 | 6 |
| 28-57 | 6 | 7 |
| 58-120 | 7 | 8 |
| 121-247 | 8 | 9 |
| $2^{(p-1)}$ to $2^P - p + 1$ | p | p + 1 |

As seen from the preceding table, it requires 8 additional bits to implement ECC+DED for a word width of sixty-four bits. As such, it is common for memories to be provided in seventy-two bit widths (64 data bits plus 8 parity bits). Because the complexity of the ECC operation increases as the word width increases, it is difficult to implement ECC on large words such as a 128 bit words. So such words are often divided into two sub-words of sixty-four bits each. Thus, memories are also provided with widths of 144 bits to store the 72 bits each for such words along with their parity bits.

But note that savings are provided if the large word is divided into two non-equal portions. For example, a 128-bit wide word may be divided into a 57-bit word and a 71-bit word (or a 56-bit word and a 72-bit word if even number word widths are desired). In this fashion, the total number of additional bits for ECC+DED becomes 7 (for the 56 or 57-bit word) and 8 (for the 71 or 72-bit word). In this fashion, the total memory word width for storing a 128 bit ECC+DED encoded word becomes just 143 bits rather than 144 bits. Note that such a bit savings is provided without any significant increase in complexity. The maximum complexity in this example has increased to a 72-bit word plus 8 redundant bits as opposed to a 64-bit word plus 8 redundant bits. In this fashion, any word width that is an integral power of two (which is typical for almost all signals) will benefit from an asymmetric division for an ECC encoding Another application of XOR circuits occurs when implementing error correction coding on a memory. In such memories, one implements even parity on all input bits to the memory to calculate parity bits, where the number of parity bits p, equals $\log_2 d+1$ assuming d is the number of data bits desired. These parity bits are implemented at positions $2^n-1$ in the memory, where the memory starts from position 0 and n ranges from 0 until p−1. Each parity bit is the even parity of all locations in the memory where the binary representation of the real position of the bit has a 1 in the bit location corresponding to the parity bit number. The real position is defined as the actual position assuming one counts from 1 or can be thought of as the position +1 as memories commonly start at position 0. For example for a 64 data bit, 7 parity bit memory (71,64), parity bit 1 will be the parity of positions 1, 3, 5 . . . 71 (represented in the memory as 0, 2, 4 . . . 70) and parity bit 2 will be positions 2, 3, 6, 7 . . . 62, 63 (1, 2, 5, 6 . . . 61, 62). As a further example, one can see that position 62 (61 in memory terms) is represented in binary as 0111110. This means parity bits 2, 3, 4, 5 and 6 will use the data at this bit when calculating parity for this memory and parity bits 1 and 7 will not.

When writing into the memory, the parity bit counts its own position as having an input of 0. When reading from the memory, the same parity system is used with the exception that the bit in the position of the parity bit itself is counted and is not considered 0 by default. This value will be whatever was written to the parity spot when the data was input to get an even parity for its set. The result of the read set of parity is known as a check bit and all the check bits should be an even parity of 0 if the memory has no errors. If there is a single error, the check bits will come out to a binary representation of the position in the memory with the error.

When implementing a (71,64) memory such as the one described above, one can see that each parity bit is the XOR of a chain of up to 36 bits, which would be really slowly calculated if the parity is calculated in series. Therefore, the bits are broken up into smaller subsets and then the results of those sets are 'XORed' with each other to find the final parity. For the (71,64) memory discussed above, 'XORing' the bits in sets of 8 in the first level and then 'XORing' those 4 or 5 sets together in the second level yields an optimal result in speed and space savings.

Referring back to the previous example of position 62 in the memory, one can see that five of the parity bits require its data to calculate their parity. This means that there would need to be five different XOR's in this position. This is especially harmful because most of the other positions in a (71,64) memory will need much fewer XOR's and much of the space will be wasted. To combat this, a sharing system is disclosed to minimize the maximum number of XOR's in any one location. For parity bits that take the even parity of a set of the same bits as another parity bit, this sharing system does not redo the calculation but instead reuses the results, or shares the results from a similar path. For example, consider the fashion in which ECC is done for a (71,64) memory as illustrated in FIG. 5.

Each set of connected "x's" represents one set of 8 that is XORed together together in a first level to be sent to the next set of 8 in a second level (although one can see some of the sets at the end are smaller than 8). One can clearly see that real position 62 needs 5 XOR's, but by using sharing one can get away with a single XOR. When calculating check bit 2 you take the parity of the bits in position 62 and 63 first then send the result left to position 59 and that result to 58 and so on going left. Check bit 3 also needs the parity of positions 62 and 63 but instead of redoing the calculation and putting another XOR in location 62, one just takes the result as calculated for check bit 2. Further one can see that the result of the XOR of bits 60, 61, 62 and 63 from check bit 3 can be shared for check bit 4. Finally check bits 5 and 6 have a set of 8 that are identical to the set of 8 used in check bit 4. Therefore no repetitive calculations are performed and one can save in the number of XOR's needed in any location. With this type of system one saves in the number of XOR's needed for the first level of 'XORing' as well as in the second level, as entire first level sets for check bits 5 are identical to sets in check bit 4. Further the first 2 sets in check bit 5 and 6 are exactly identical so the second level of 'XORing' for check bit 6 and can just share the result from the second level of check bit 5.

As long as the parity calculations are calculated from right to left, using a sharing system like this reduces the maximum number of XOR's per bit for a (71,64) memory from 5 to 3.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

I claim:

1. An exclusive-OR (XOR) calculation circuit configured to XOR a plurality of N input signals ranging from a first signal to an Nth signal, comprising:

a plurality of logic circuits arranged from a first logic circuit to a last logic circuit, wherein each logic circuit is configured to receive two logical input signals and the complement of the two logical input signals and to provide an XOR output signal and an XNOR output signal, wherein the XOR output signal represents the XOR of its two input signals and the XNOR output signal represents an exclusive-NOT-OR (XNOR) of its two input signals, and wherein the first logic circuit receives two of the N input signals as its logical input signals, a second logic circuit receives another one of the N input signals and an XOR output signal from the first logic circuit as its logical input signals, and so on such that the last logic circuit receives a remaining one of the N input signals and an XOR output signal from a next-to-last logic circuit as its logical input signals.

* * * * *